United States Patent
Huber et al.

(10) Patent No.: US 6,747,458 B2
(45) Date of Patent: Jun. 8, 2004

(54) METHOD FOR MONITORING THE GROUND POTENTIAL OF A RECTIFIER DRIVE

(75) Inventors: Norbert Huber, Teisendorf (DE); Franz Ritz, Übersee (DE)

(73) Assignee: Johannes Heidenhain GmbH, Traunreut (DE)

(*) Notice: Subject to any disclaimer, the term of this patent is extended or adjusted under 35 U.S.C. 154(b) by 0 days.

(21) Appl. No.: 10/259,195

(22) Filed: Sep. 27, 2002

(65) Prior Publication Data

US 2003/0067303 A1 Apr. 10, 2003

(30) Foreign Application Priority Data

Sep. 27, 2001 (DE) .......................... 101 48 740

(51) Int. Cl.⁷ .......................... G01R 31/08; H02H 7/125
(52) U.S. Cl. ...................... 324/527; 324/523; 324/509; 363/50; 361/59
(58) Field of Search ............... 324/527, 523, 324/509–511, 725, 610, 548, 772; 363/50, 52, 53; 361/18, 59, 115

(56) References Cited

U.S. PATENT DOCUMENTS

| | | | | |
|---|---|---|---|---|
| 3,857,070 A | * | 12/1974 | Smith | 361/44 |
| 4,198,628 A | * | 4/1980 | Laber | 340/650 |
| 4,253,056 A | | 2/1981 | Chaudhary | 324/509 |
| 4,364,007 A | * | 12/1982 | Cutler et al. | 324/500 |
| 5,363,018 A | * | 11/1994 | Shackle | 315/127 |
| 6,331,941 B1 | | 12/2001 | Smith | 363/37 |
| 6,396,721 B1 | | 5/2002 | Sonoda et al. | 324/509 |

FOREIGN PATENT DOCUMENTS

| | | |
|---|---|---|
| DE | 39 23 594 A1 | 2/1990 |
| DE | 41 09 586 A1 | 9/1992 |
| DE | 198 37 796 A1 | 2/2000 |
| EP | 1 122 849 A2 | 8/2001 |
| WO | WO 01/06272 A1 | 1/2001 |

* cited by examiner

Primary Examiner—Anjan K. Deb
(74) Attorney, Agent, or Firm—Brinks Hofer Gilson & Lione

(57) ABSTRACT

A method for ground potential monitoring of a rectifier drive, having a capacitor which is connected with a voltage source via a switching device. The method including applying a test voltage between a connector of a capacitor of a rectifier drive and a mass or ground potential prior to connecting the rectifier drive with a voltage source that is connected with the capacitor via a switching device. The method also includes releasing the switching device if a potential of the connector changes by a predetermined amount after the applying the test voltage.

25 Claims, 3 Drawing Sheets

METHOD FOR MONITORING THE GROUND POTENTIAL OF A RECTIFIER DRIVE

Applicants claim, under 35 U.S.C. § 119, the benefit of priority of the filing date of Sep. 27, 2001 of a German patent application, copy attached, Serial Number 101 48 740.1, filed on the aforementioned date, the entire contents of which is incorporated herein by reference.

BACKGROUND OF THE INVENTION

1. Field of the Invention

The present invention relates to a method for ground potential monitoring of a rectifier drive, having a capacitor which is connected with a voltage source via a switching device. The present invention further relates to a device for executing the method.

2. Discussion of Related Art

A ground potential detector includes a detector circuit, which is switched parallel to a load and a d.c. voltage source, is known from U.S. Pat. No. 4,253,056, the entire contents of which are incorporated herein by reference. The detector circuit has two voltage dividers, each with series-connected resistors, each of whose connections are made at an input of a voltage comparator. The comparator inputs are furthermore connected with a mass or ground potential by respective diodes, which are polarized in oppositely oriented conducting directions. A ground potential occurring in the d.c. circuit changes the polarity at the comparator inputs and calls up an output signal from the voltage comparator to indicate the ground potential.

However, the known ground potential detector only indicates a ground potential in the charging circuit in case of a load already connected to the d.c. source, i.e. during an active operation, and not prior to connecting the load to the supply voltage source. But if a ground potential already exists prior to connecting the load to the supply voltage source, this can already lead to the destruction of components, in particular to the destruction of electronic components for triggering semiconductor power switches, because of high fault currents. This will be explained by an intermediate circuit frequency converter for supplying a three-phase motor with current from a three-phase supply network represented in FIG. 1.

The three-phase intermediate circuit frequency converter 3, 4, 5 represented in FIG. 1 is composed of a charging rectifier 3 with charging diodes 31, 32 arranged in a three-phase bridge circuit, a d.c. intermediate circuit 4 with a charging resistor or a constant current source 41, an intermediate circuit capacitor 40 and an intermediate circuit resistor 42 connected in parallel with the intermediate circuit capacitor 40, as well as a semiconductor power switch 5 with semiconductor switches 51 to 56, embodied as IGBT (Isolated Gate Bipolar Transistor) and also arranged in a three-phase bridge circuit, parallel to whose charging connectors recovery diodes 61 to 66 have been switched, which are polarized anti-parallel with the conducting direction of the semiconductor switches 51 to 56. On the input side, the intermediate circuit frequency converter 3, 4, 5 is connected via a charge relay 2 to a current-supplying three-phase supply network with phases L1, L2 and L3, and on the output side it supplies a three-phase motor 7 via the phases R, S and T.

The intermediate circuit capacitor 40 is supplied with current via the charging resistor, or constant current source 41, and smooths the output voltage of the charging rectifier 3 and stores the intermediate circuit energy. In this case, the charging resistor, or constant current source 41, limits the inrush current, because in the uncharged state the usually very large intermediate circuit capacitor 40 acts like a short circuit, which causes a large inrush current. The latter would result in the destruction of components of the intermediate circuit frequency converter, inter alia of the charge relay 2, of the rectifier 3, of the intermediate circuit capacitor 40, of one or several of the recovery diodes 61 to 66, of upstream-connected fuses and/or of strip conductors of the printed circuit board.

The electronic drive device connected to the control connections of the semiconductor power switches 51 to 56 determines the drive frequency and, via the current and voltage time surfaces, the motor voltage on the output side, or the motor current, wherein the driving of the individual motor phases R, S, T is performed by pulse width modulation. In this case the recovery diodes 61 to 66, which are connected anti-parallel with respect to the conducting direction of the semiconductor power switches 51 to 56, take over the current flow when the semiconductor power switches 51 to 56 which are assigned to them are switched off.

If, in the exemplary embodiment represented in FIG. 1, the intermediate circuit capacitor 40 is charged, a voltage of for example −280 V is applied to the negative connector −UZ of the intermediate circuit capacitor 40, and to the positive connector +UZ of the intermediate circuit capacitor 40 a voltage of +280 V with respect to the mass or ground potential. If the three phase switches of the charge relay 2 are closed, and therefore the charging rectifier 3 is connected to the three-phase network 1 supplying the voltage, the charging rectifier 3 generates a voltage of approximately 560 V on the d.c. side, which drops completely at the charging resistor 41, because the intermediate circuit capacitor 40 is still uncharged during switch-on and therefore acts as a short circuit. The charging resistor 41 limits the charge current shortly after the charge relay 2 has been switched on, and in this switch-on moment −280 V with respect to the mass or ground potential are applied to both connectors +UZ and −UZ of the intermediate circuit capacitor 40. With increasing charging of the intermediate circuit capacitor 40, the potential of the positive connector +UZ of the intermediate circuit capacitor 40 is increased to +280 V.

If prior to or during the switch-on process a ground potential occurs in one phase or several phases R, S, T before the intermediate circuit capacitor 40 has been charged, the positive connector +UZ of the intermediate circuit capacitor 40 is more negative by up to 280 V than the mass or ground potential. Because of this, in the course of closing the charge relay 2 a short circuit current flows through one of the recovery diodes 57 to 62, the intermediate circuit capacitor 40 and one diode of the diode branch 31, 32 of the charging rectifier 3, i.e. a very high short circuit current flows between the positive connector +UZ of the intermediate circuit capacitor 40 and the mass or ground potential, which suddenly charges the intermediate circuit capacitor 40, so that there is the previously described danger of the destruction of components of the intermediate circuit capacitor.

FIG. 1 shows in dashed lines a ground potential of the phase T which, when the charge relay 2 is closed, results in the recovery diode 65 becoming conductive, so that a short circuit current flows over the recovery diode 65, the intermediate circuit capacitor 40 and the charging diodes 32 of the charging rectifier 3, which can result in the previously described destruction of the electronic drive device of the intermediate circuit capacitor.

OBJECT AND SUMMARY OF THE INVENTION

It is an object of the present invention to disclose a method for ground potential monitoring of a rectifier drive of the species mentioned at the outset, which detects a ground potential prior to connecting the rectifier with a voltage source providing electrical current by a simple technical circuit.

In accordance with the present invention, this object is attained by a method for ground potential monitoring of a rectifier drive, having a capacitor which is connected with a voltage source via a switching device. The method including applying a test voltage between a connector of a capacitor of a rectifier drive and a mass or ground potential prior to connecting the rectifier drive with a voltage source that is connected with the capacitor via a switching device. The method also includes releasing the switching device if a potential of the connector changes by a predetermined amount after the applying the test voltage.

It is another object of the present invention to disclose a device for executing the method for ground potential monitoring of a rectifier drive.

This further object is attained by a ground potential monitoring system including a voltage source and a rectifier drive that includes controllable semiconductor power switches, recovery diodes arranged parallel with respect to charging connectors of the semiconductor power switches and a capacitor connected via a switching device with the voltage source, wherein the capacitor includes a negative potential connector. At least one electric motor drive connected to the semiconductor power switches. A comparator that includes a first input connected to the negative potential connector, a second input connected to a reference voltage source and an output connected to a triggering device, wherein the negative potential connector is charged with a test voltage.

The method of the present invention makes it possible to detect a ground potential at the output of the rectifier drive ahead of time by a simple electrical circuit, and to give out an appropriate signal indicating the ground potential, or blocking the closing of a network voltage switch.

The solution in accordance with the present invention can be basically employed with any type of rectifier circuit having a charging or intermediate circuit capacitor, i.e. not only in connection with such intermediate circuit frequency converters as explained above, but also in connection with single- or multi-phase inverters, as well as single- or multi-phase pulse inverters and frequency converters. The solution in accordance with the present invention is also not limited to drive systems, but can be employed with any single- or multi-phase load.

The solution in accordance with the present invention is based on the knowledge that already prior to closing the switching device, i.e. prior to connecting the rectifier to the supply voltage source, a check is made whether the potential of the negative connection of the charging or intermediate circuit capacitor can be displaced in relation to ground potential. If a displacement of the negative connection of the charging or intermediate circuit capacitor is not possible, a ground potential exists in one of the load phases, while, with the charging connector intact, the test voltage superimposed on the potential of the charging or intermediate circuit capacitor leads to a corresponding displacement of the potential of the negative connection, so that the switching device for connecting the rectifier to the supply voltage source can be released.

An advantageous embodiment of the method of the present invention provides for the comparison of the potential of the capacitor connector with a reference potential after the test voltage has been applied and, in case of a predetermined deviation of the potential of the capacitor connector from the reference potential, for blocking the switching device.

In relation to an intermediate circuit frequency converter, whose input side is connected with an a.c. or a three-phase supply network and whose output side is connected with one or several electric motor drive(s), and in whose indirect circuit an intermediate circuit capacitor and a charging resistor or a constant current source are arranged, the negative connector of the intermediate circuit capacitor is charged with the test voltage and, following a predetermined change of the negative connection of the intermediate circuit capacitor in regard to the mass or ground potential, the switching device is released.

With this special application of the method in accordance with the present invention it is possible, too, to apply a negative test voltage to the negative connector of the intermediate circuit capacitor and to compare it with a reference potential, so that the switching device is released when the potential of the negative connector of the intermediate circuit capacitor reaches or falls below the reference potential.

It is alternatively possible to apply a positive test voltage to the negative potential connector of the intermediate circuit capacitor, to compare it with a reference potential and to release the switching device when the potential of the negative potential connector of the intermediate circuit capacitor reaches or rises above the reference potential.

The negative or positive test voltage can be obtained in both methods in that the negative or positive half-waves from the a.c or three-phase current net supplying the electricity are applied via a high-impedance resistor to the negative connector of the intermediate circuit capacitor.

A device for executing the method in accordance with the present invention for a rectifier drive with controllable semiconductor power switches having recovery diodes arranged parallel with respect to the charging connectors of the semiconductor power switches, having a capacitor, which is connected via a switching device with a voltage source, and having at least one electric motor drive connected to the semiconductor power switches, is distinguished in that the negative potential connector of the capacitor is charged with a test voltage and connected with a first input of a comparator, to whose second input a reference voltage source is connected, and whose output is connected with a triggering device.

The triggering device can include an arrangement for releasing or blocking the switching device, and/or an indicator device, which are connected with the output of the comparator. To prevent erroneous switching and in this way to assure that no components of the intermediate circuit frequency converter are damaged or destroyed by too high a short circuit current, the release or blocking of the switching device for connecting the rectifier to the supply voltage source should be given preference wherein, in addition to the release or blocking of the switching device, an appropriate indicator is advantageous in order to give the user the option of error searching and error remedy. The indicator itself can include an optical or acoustic signal, or a combination of the two.

In an intermediate circuit frequency converter having a charging rectifier, whose input is connected via a charging relay with an a.c. or three-phase current network for providing electricity, having an intermediate circuit capacitor, which is connected by a charging resistor or a constant current source with the charging rectifier, a first input of a comparator is connected via a voltage divider with the negative potential connector of the intermediate circuit capacitor, as well as with a charging resistor, and a diode circuit is connected with the a.c. or three-phase current network for providing electricity, and the second input is charged with a reference voltage.

A negative or positive test voltage in the form of a d.c. voltage superimposition for detecting a ground potential can be generated by a diode circuit connected on the cathode side or the anode side with the a.c. or three-phase current network for providing electricity and applied to one input of the comparator, while a negative or positive reference voltage is applied to a second input of the comparator.

Alternatively to the formation of a negative or positive test voltage for detecting a ground potential by a d.c. voltage superimposition, it is also possible to provide an a.c. voltage as the test voltage for detecting a ground potential by an a.c. voltage superimposition. In this embodiment, the first input of the comparator is connected via a voltage divider to the cathode of a diode, whose anode is connected with the negative potential connector of the intermediate circuit capacitor and via a resistor with the a.c. or three-phase current network for providing electricity, and the second comparator input is charged with a positive reference voltage, wherein a capacitor is switched parallel with the one resistor of the voltage divider connected with the mass or ground potential.

The method and the device for executing the method in accordance with the present invention are particularly suitable for detecting a ground potential in on or several phases of a multitude of output elements connected to a circuit of an intermediate circuit capacitor, in particular of a.c. or three-phase current motors, since the method in accordance with the present invention tests all phases of the load connector simultaneously for ground potential without one of the load phases having to be energized.

The idea on which the present invention is based will be described in greater detail by exemplary embodiments represented in the drawings.

DETAILED DESCRIPTION OF THE PREFERRED EMBODIMENTS

FIG. 1 shows a three-phase current intermediate circuit frequency converter 3, 4, 5, which is connected to a current-supplying three-phase supply network 1 via a charge relay 2 for supplying a three-phase motor 7 with phases R, S, T, such as was described above by FIG. 1 for explaining the problem at the root of the present invention.

Figure 1:
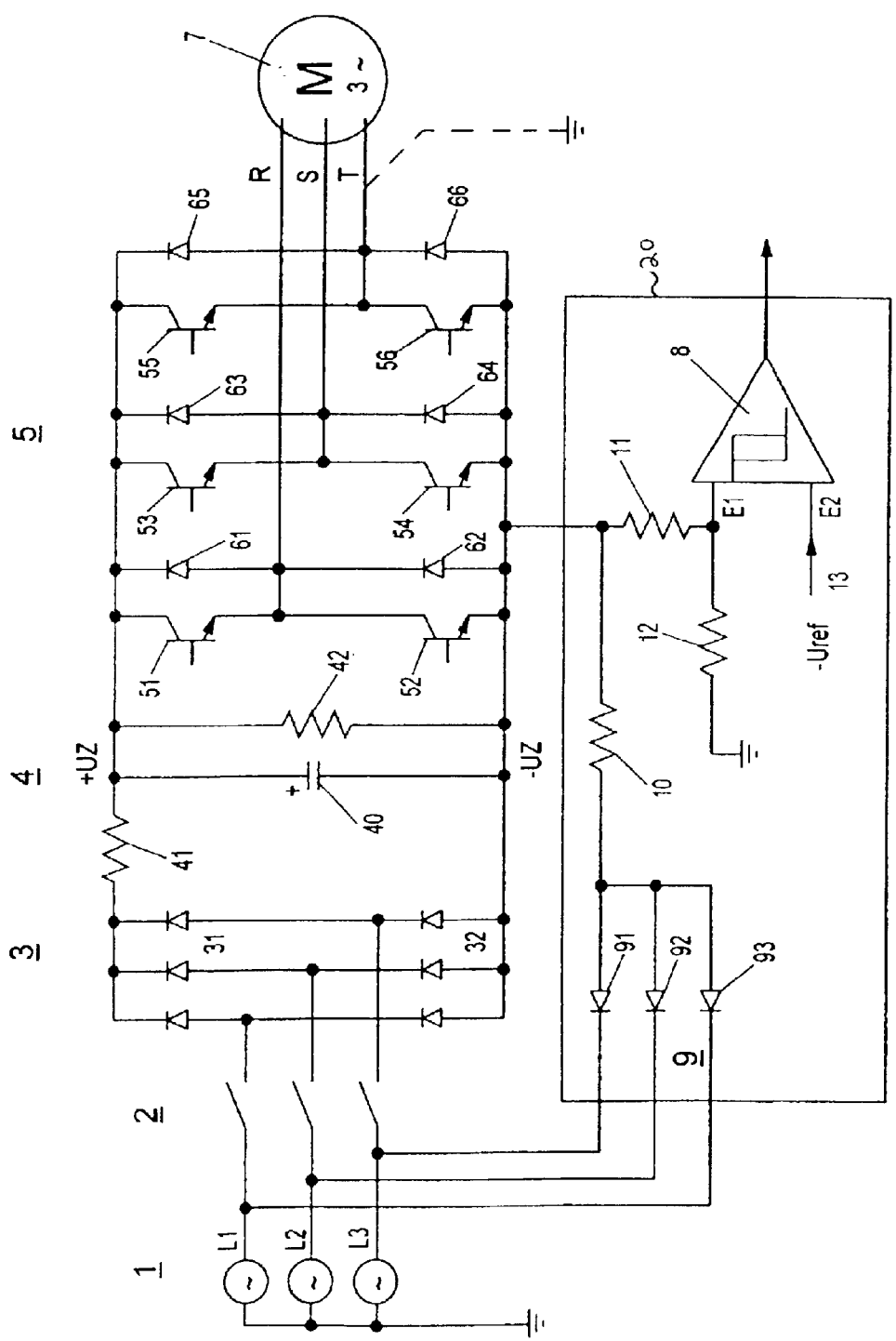
FIG. 1 shows an embodiment of a circuit for ground potential monitoring of an intermediate circuit capacitor, having a ground potential detection circuit by negative d.c. voltage superimposition in accordance with the present invention.

A framed ground potential detection circuit 20 according to the present invention is attached to the phases L1, L2, L3 of the network 1. The circuit 20 is composed of a diode circuit 9 for generating a test voltage, a comparator 8, a voltage divider 11, 12, and a reference voltage connector 13. The negative test voltage, which in the exemplary embodiment in accordance with FIG. 1 is negative, is generated by the diode circuit 9, which includes three diodes 91, 92, 93, which are connected at the cathode side to the phases L1, L2, L3 of the current-supplying three-phase supply network 1. The anodes 91, 92, 93, which are connected with each other, are connected via a high-impedance resistor 10 with the negative connector –UZ of the intermediate circuit capacitor 40, which at the same time is a connecting point for a voltage divider formed from two series-connected resistors 11, 12.

The voltage divider 11, 12 is connected with the mass or ground potential, and the connectors of the two voltage divider resistors 11, 12 with a first input E1 of the comparator 8. A reference voltage –Uref of –5 V, for example, is applied to the second input E2 of the comparator 8. The output of the comparator 8 is connected with a triggering device, not shown in detail, for example a control circuit for the charge relay 2 and/or an indicator device.

The function of the ground potential detection circuit in accordance with FIG. 1 will be explained in greater detail in what follows:

The diodes 91, 92, 93 of the diode circuit 9 apply the negative half-waves of the supply voltage of the current-supplying three-phase supply network 1 via the high-impedance resistor 10 to the negative connector –UZ of the intermediate circuit capacitor 40. This causes a current flow of a few milliampere which, however, if there is no ground potential, must draw the potential of the negative connector –UZ of the intermediate circuit capacitor 40 towards more negative values. In the ideal case the potential of the negative connector –UZ of the intermediate circuit capacitor 40 is –280 V when the test current is applied. However, for reasons of circuitry technology, the voltage at the negative connector –UZ of the intermediate circuit capacitor 40 lies below this in one of the phases R, S, T of the three-phase motor 7, even if no ground potential exists, so that, for example, it is possible to predetermine the criteria that, with a potential of approximately –50 V and lower at the negative connector –UZ of the intermediate circuit capacitor 40, no ground potential exists.

With the aid of the voltage divider formed from the voltage divider resistors 11, 12, the voltage at the first input E1 of the comparator 8 is reduced by a factor of 10 and is compared with the reference voltage –Uref of –5 V, for example, at the second input E2 of the comparator 8. If a lower potential exists at the first input E1 of the comparator 8 than at its second input E2, the comparator 8 sends a release signal to the charging relay 2.

But if in the case of a ground potential in one of the three phases R, S, T at the output of the intermediate circuit frequency converter 3, 4, 5, the negative connector –UZ of the intermediate circuit capacitor 40 cannot follow the negative test voltage, i.e. switch to a negative potential, since in the case of a ground potential in the phase T and with the intermediate circuit capacitor still not charged at the switch-on time, no more than the diode voltage can drop via the recovery diode 65, so that the switching criteria of, for example, –50 V can no longer be attained as long as the intermediate circuit capacitor 40 remains uncharged. In this case, the comparator 8 sends an appropriate signal to the triggering device, for example a blocking signal to the charge relay 2 as well as possibly a signal to an optical and/or acoustic indicator device.

Figure 2:
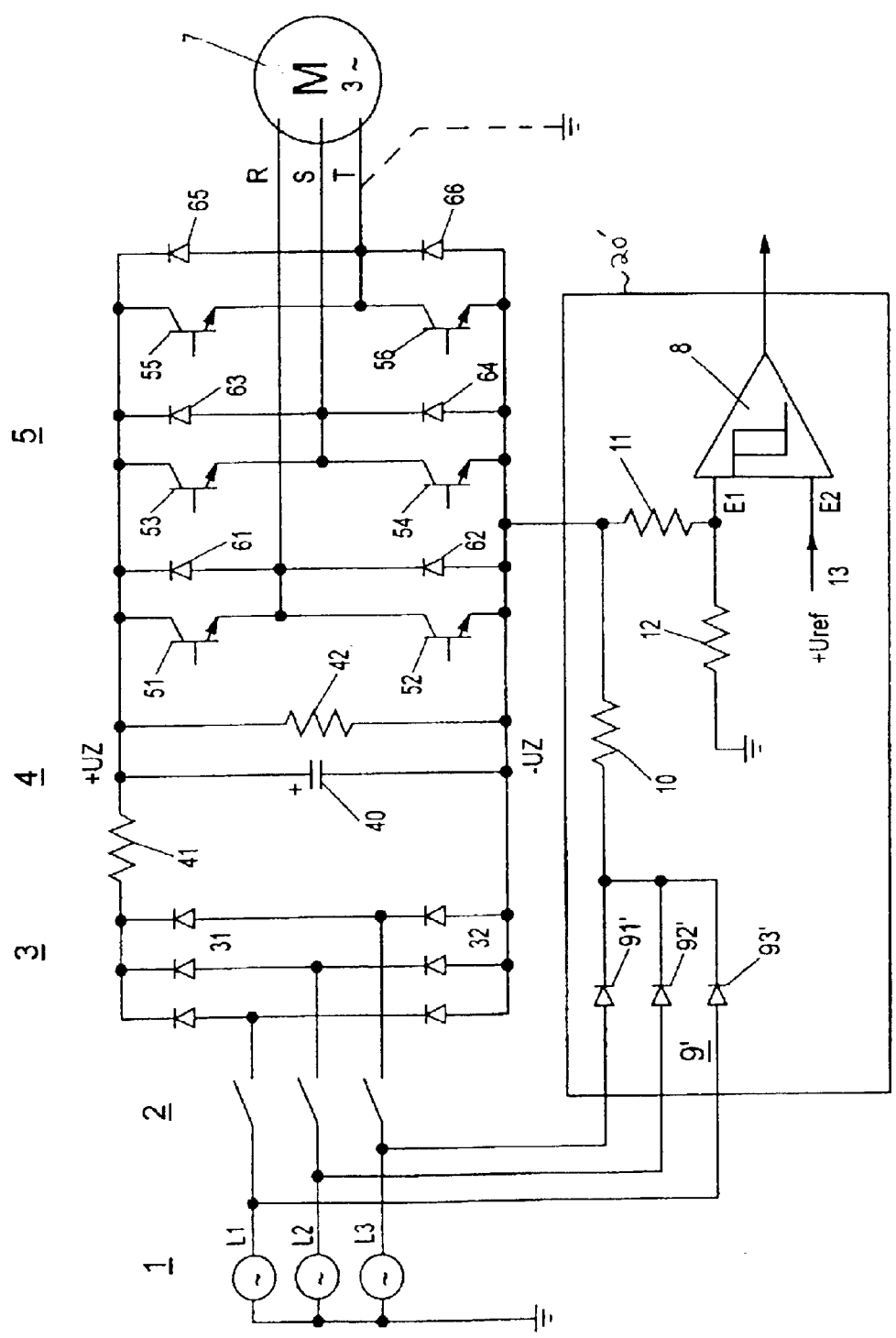
FIG. 2 shows an embodiment of a circuit with a ground potential detection circuit by positive d.c. voltage superimposition in accordance with the present invention.

In the circuit in accordance with FIG. 2, a positive test voltage is generated in the ground potential detection circuit 20', and accordingly the negative connector −UZ of the intermediate circuit capacitor is pulled to a positive potential. This is created by reversing the connectors of the diode circuit 9, i.e. the modified diode circuit 9' has three diodes 91', 92', 93', which are connected on the anode side to the phases L1, L2, L3 of the current-supplying three-phase network 1, whose cathodes are connected via the high-impedance resistor 10 with the negative connector −UZ of the intermediate circuit capacitor 40.

In this embodiment the ground potential detection even functions with a charged intermediate circuit capacitor 40 since, with a positive potential at the negative connector −UZ of the intermediate circuit capacitor 40, the recovery diode 66 (in case of a ground potential in the phase T) is conductive, and only the diode voltage of the recovery diode 66 can be reached again.

In connection with this embodiment of a ground potential detection circuit it is disadvantageous that a voltage of approximately 560 V (−280 V from the negative connector −UZ of the intermediate circuit capacitor 40 and +280 V from the positive test voltage, i.e. the voltage at the anodes of the diodes 91', 92', 93') exists at the high-impedance resistor 10, so that the high-impedance resistor 10 continuously consumes energy. However if the potential on both sides of the high-impedance resistor 10 is −280 V, for example, no voltage is applied to the high-impedance resistor 10, so that no energy is consumed in this case.

Figure 3:
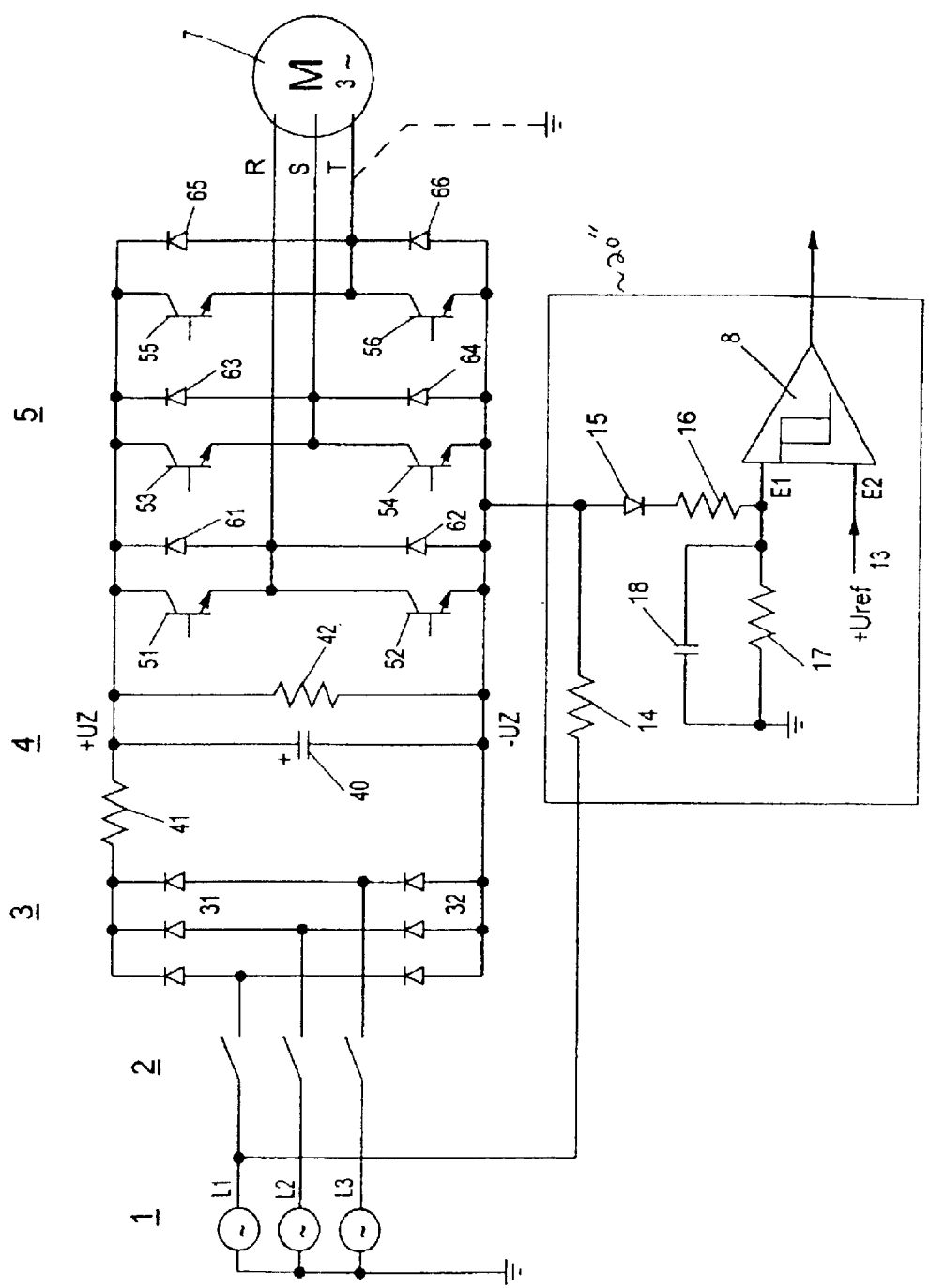
FIG. 3 shows an embodiment of a circuit having a ground potential detection circuit by a.c. voltage superimposition in accordance with the present invention.

In a further simplified ground potential detector circuit 20'' in accordance with FIG. 3, the diode circuit 9 is omitted. An a.c. voltage is applied to the negative connector −UZ of the intermediate circuit capacitor 40 via a resistor 14 directly connected to the phase L1 of the current-supplying three-phase network 1. The positive portion of the resulting a.c. voltage potential is selected by a diode 15 connected on the anode side to the negative connector −UZ of the intermediate circuit capacitor 40 and is applied to the first input E1 of the comparator 8 via a voltage divider formed from two voltage divider resistors 16, 17.

In this circuit a capacitor 18, which is connected parallel with the second voltage resistor 17, is used for smoothing of the signal applied to the first input E1 of the comparator 8.

As in the above described exemplary embodiments, a reference voltage 13 applied to the second input E2 of the comparator 8 is used as the criteria for sending a release or blocking signal, or a signal to a downstream-connected indicator device, from the comparator 8 of the ground potential detector circuit to the charge relay 2.

Within the scope of the present invention, further embodiment variations of course also exist besides the explained example.

We claim:

1. A method for ground potential monitoring of a rectifier drive, having a capacitor which is connected with a voltage source via a switching device, the method comprising:
   applying a test voltage between a connector of a capacitor of a rectifier drive and a mass or ground potential prior to connecting said rectifier drive with a voltage source that is connected with said capacitor via a switching device; and
   releasing said switching device if a potential of said connector changes by a predetermined amount after said applying said test voltage.

2. The method in accordance with claim 1, further comprising comparing said potential of said connector with a reference potential and wherein said releasing is performed when a predetermined deviation of said connector from said reference potential is not achieved.

3. The method in accordance with claim 2, wherein said rectifier drive further comprises an intermediate circuit frequency converter, which is connected on an input side with a current-supplying a.c.- or three-phase supply network via a charge relay, and on an input side with an electric motor drive mechanism, and said intermediate circuit further comprises an intermediate circuit capacitor and a charge resistor or a constant current source.

4. The method in accordance with claim 3, further comprising charging a negative potential connector of said intermediate circuit capacitor with said test voltage; and
   wherein said releasing is performed upon reaching a predetermined change of said negative potential connector with respect to said mass or ground potential.

5. The method in accordance with claim 4, further comprising:
   applying a negative test voltage to said negative potential connector;
   comparing said negative test voltage with a reference potential; and
   wherein said releasing is performed when a potential of said negative potential connector reaches or falls below said reference potential.

6. The method in accordance with claim 4, further comprising:
   applying negative half-waves of said current-supplying a.c.- or three-phase supply network to said negative potential connector; and
   wherein said releasing is performed when a potential of said negative potential connector reaches or falls below a predetermined negative potential.

7. The method in accordance with claim 4, further comprising:
   applying a positive test voltage to said negative potential connector;
   comparing said positive test voltage with a reference potential; and
   wherein said releasing is performed when a potential of said negative potential connector reaches or exceeds said reference potential.

8. The method in accordance with claim 7, further comprising:
   applying positive half-waves of said current-supplying a.c.- or three-phase supply network to said negative potential connector of said intermediate circuit capacitor; and
   wherein said releasing is performed when a potential of said negative potential connector reaches or exceeds a predetermined negative potential.

9. The method in accordance with claim 4, further comprising:
   applying positive half-waves of said current-supplying a.c.- or three-phase supply network to said negative potential connector of said intermediate circuit capacitor; and
   wherein said releasing is performed when a potential of said negative potential connector reaches or exceeds a predetermined negative potential.

10. The method in accordance with claim 1, wherein said rectifier drive further comprises an intermediate circuit frequency converter, which is connected on an input side with a current-supplying a.c.- or three-phase supply network via a charge relay, and on an input side with an electric motor drive mechanism, and said intermediate circuit further comprises an intermediate circuit capacitor and a charge resistor or a constant current source.

11. The method in accordance with claim 10, further comprising charging a negative potential connector of said intermediate circuit capacitor with said test voltage; and
   wherein said releasing is performed upon reaching a predetermined change of said negative potential connector with respect to said mass or ground potential.

12. The method in accordance with claim 11, further comprising:
   applying a negative test voltage to said negative potential connector;
   comparing said negative test voltage with a reference potential; and
   wherein said releasing is performed when a potential of said negative potential connector reaches or falls below said reference potential.

13. The method in accordance with claim 11, further comprising:
   applying negative half-waves of said current-supplying a.c.- or three-phase supply network to said negative potential connector; and
   wherein said releasing is performed when a potential of said negative potential connector reaches or falls below a predetermined negative potential.

14. The method in accordance with claim 11, further comprising:
   applying a positive test voltage to said negative potential connector;
   comparing said positive test voltage with a reference potential; and
   wherein said releasing is performed when a potential of said negative potential connector reaches or exceeds said reference potential.

15. The method in accordance with claim 14, further comprising:
   applying positive half-waves of said current-supplying a.c.- or three-phase supply network to said negative potential connector of said intermediate circuit capacitor; and
   wherein said releasing is performed when a potential of said negative potential connector reaches or exceeds a predetermined negative potential.

16. The method in accordance with claim 11, further comprising:
   applying positive half-waves of said current-supplying a.c.- or three-phase supply network to said negative potential connector of said intermediate circuit capacitor; and
   wherein said releasing is performed when a potential of said negative potential connector reaches or exceeds a predetermined negative potential.

17. A ground potential monitoring system comprising:
   a voltage source;
   a rectifier drive comprising:
      controllable semiconductor power switches; and
      recovery diodes arranged parallel with respect to charging connectors of said semiconductor power switches;
   a capacitor connected via a switching device with said voltage source, wherein said capacitor comprises a negative potential connector;
   at least one electric motor drive connected to said semiconductor power switches;
   a comparator comprising:
      a first input connected to said negative potential connector;
      a second input connected to a reference voltage source; and
      an output connected to a triggering device;
   wherein said negative potential connector is charged with a test voltage.

18. The device in accordance with claim 17, wherein said triggering device comprises an arrangement for releasing or blocking said switching device.

19. The device in accordance with claim 18, wherein said triggering device comprises an indicator device.

20. The device in accordance with claim 17, wherein said triggering device comprises an indicator device.

21. The device in accordance with claim 17, wherein said rectifier drive comprises a charging rectifier that is connected to said switching device and is connected to said capacitor via a charging resistor or a constant current source;
   wherein said switching device is connected to a current-supplying a.c.- or three-phase supply network;
   wherein said first input of said comparator is connected via a voltage divider with said negative potential connector and said first input is connected to said current supplying a.c.- or three-phase supply network via a charging resistor and a diode circuit and wherein said second input of said comparator is charged with a reference voltage.

22. The device in accordance with claim 21, wherein a cathode side of said diode circuit is connected with said current-supplying a.c.- or three-phase supply network, and wherein a negative reference voltage is applied to said second input of said comparator.

23. The device in accordance with claim 21, wherein an anode side of said diode circuit is connected with said current-supplying a.c.- or three-phase supply network, and wherein said second input of said comparator is charged with a positive reference voltage.

24. The device in accordance with claim 17, wherein said rectifier drive comprises a charging rectifier that is connected to said switching device and is connected to said capacitor via a charging resistor or a constant current source;
   wherein said switching device is connected to a current-supplying a.c.- or three-phase supply network;
   wherein said first input of said comparator is connected via a voltage divider with a cathode of said diode, wherein an anode of said diode is connected with said negative potential connector and said first input is connected to said current supplying a.c.- or three-phase supply network via a resistor and wherein said second input of said comparator is charged with a positive reference voltage.

25. The device in accordance with claim 24, wherein a second capacitor is connected parallel with said resistor of said voltage divider, which is connected with a mass or ground potential.

* * * * *